United States Patent [19]

Martin

[11] 4,274,050
[45] Jun. 16, 1981

[54] VOLTAGE MEASURING APPARATUS
[75] Inventor: Thomas F. Martin, Richardson, Tex.
[73] Assignee: Rockwell International Corporation, El Segundo, Calif.
[21] Appl. No.: 66,262
[22] Filed: Aug. 13, 1979
[51] Int. Cl.³ .......................... G01R 17/06; H03B 3/02
[52] U.S. Cl. .................................. 324/99 D; 307/264; 328/168
[58] Field of Search ............................. 324/128, 99 D; 307/296 R, 237, 264; 328/158, 159, 162, 168; 358/34

[56] References Cited
U.S. PATENT DOCUMENTS

| | | | |
|---|---|---|---|
| 3,126,447 | 3/1964 | Bendell | 358/34 |
| 3,936,760 | 2/1976 | Rosen | 328/162 |
| 4,125,812 | 11/1978 | Polonio | 328/162 |

OTHER PUBLICATIONS

Motorola Brochure for the MC14433 3.5 Digit A/D Converter; Motorola Semicon. Prod., Inc., Austin, Texas; 1976; 12 pages.

Primary Examiner—Ernest F. Karlsen
Attorney, Agent, or Firm—Bruce C. Lutz; Howard R. Greenberg; H. Fredrick Hamann

[57] ABSTRACT

A voltage dividing and reference circuit for creating a pseudoground from a unipolar power supply such that when used in combination with a digital voltmeter circuit a bipolar input signal can be measured for both polarities with respect to ground.

4 Claims, 4 Drawing Figures

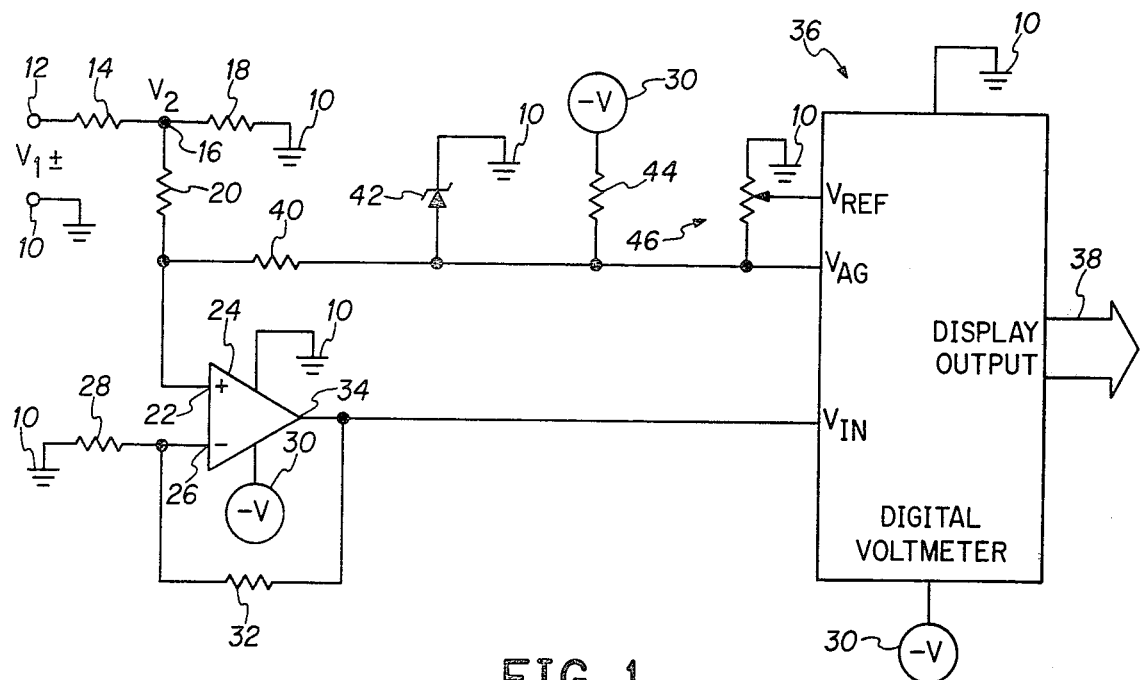
FIG. 1
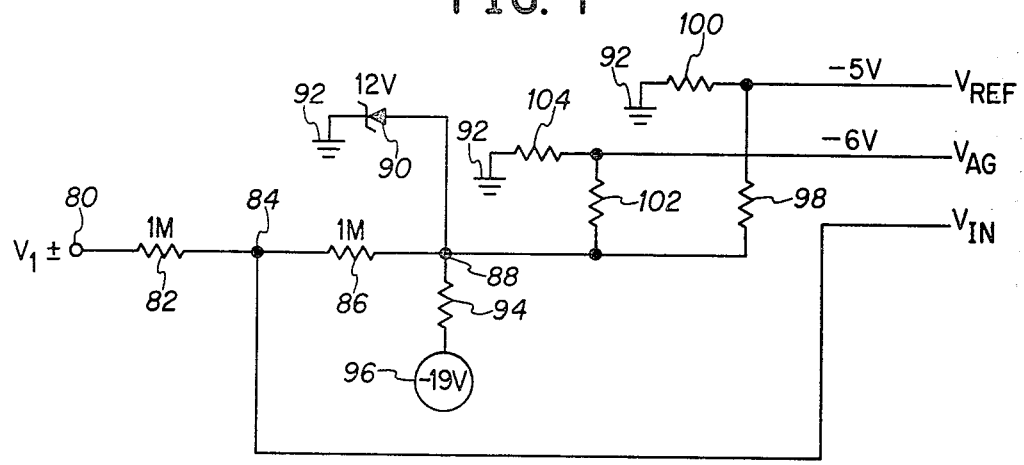
FIG. 3
| $V_1$ | $V_{IN}$ | $V_{IN}$ REL TO $V_{AG}$ |
|---|---|---|
| +2 | −5.0 | +1.0 |
| +1 | −5.5 | +0.5 |
| 0 | −6.0 | 0 |
| −1 | −6.5 | −0.5 |
| −2 | −7.0 | −1.0 |
FIG. 4

4,274,050

VOLTAGE MEASURING APPARATUS

THE INVENTION

The present invention is related to electronics and more specifically to apparatus for measuring bipolar signals. Even more specifically, it is related to a concept and circuit for generating a pseudoground which is intermediate a normal ground and the voltage of a power terminal of a unipolar power supply. This pseudoground is used in combination with a bipolar input signal in a manner such that an output signal is generated which is representative of an input signal to be measured and varies with respect to the pseudoground as does the input signal with respect to normal ground.

Present day integrated circuit digital voltmeter circuits are designed such that they need positive and negative voltage sources with respect to ground so that they may measure bipolar input signals. An application note designated as DS9423 from Motorola outlining the uses of a 3½ digit A/D converter having the Part Number MC14433 does illustrate an approach for generating the pseudoground (therein referred to as analog ground $V_{AG}$) and the voltmeter reference limit ($V_{ref}$). However, the embodiment shown requires floating input signals.

The present invention accomplishes both of the functions from a very simple circuit.

It is therefore, an object of the present invention to provide an improved circuit for altering the reference level of a bipolar signal while keeping the same relative values with respect to that reference level.

Other objects and advantages of the present invention may be ascertained from a reading of the specification and appended claims in conjunction with the drawings wherein:

FIG. 1 is a block schematic diagram of the inventive concept;

FIG. 3 is a schematic diagram of the reference level changing section of the inventive concept in simplified form; and FIG. 4 is a table of values used in explaining the operation of the inventive concept.

DETAILED DESCRIPTION

Figure 2:
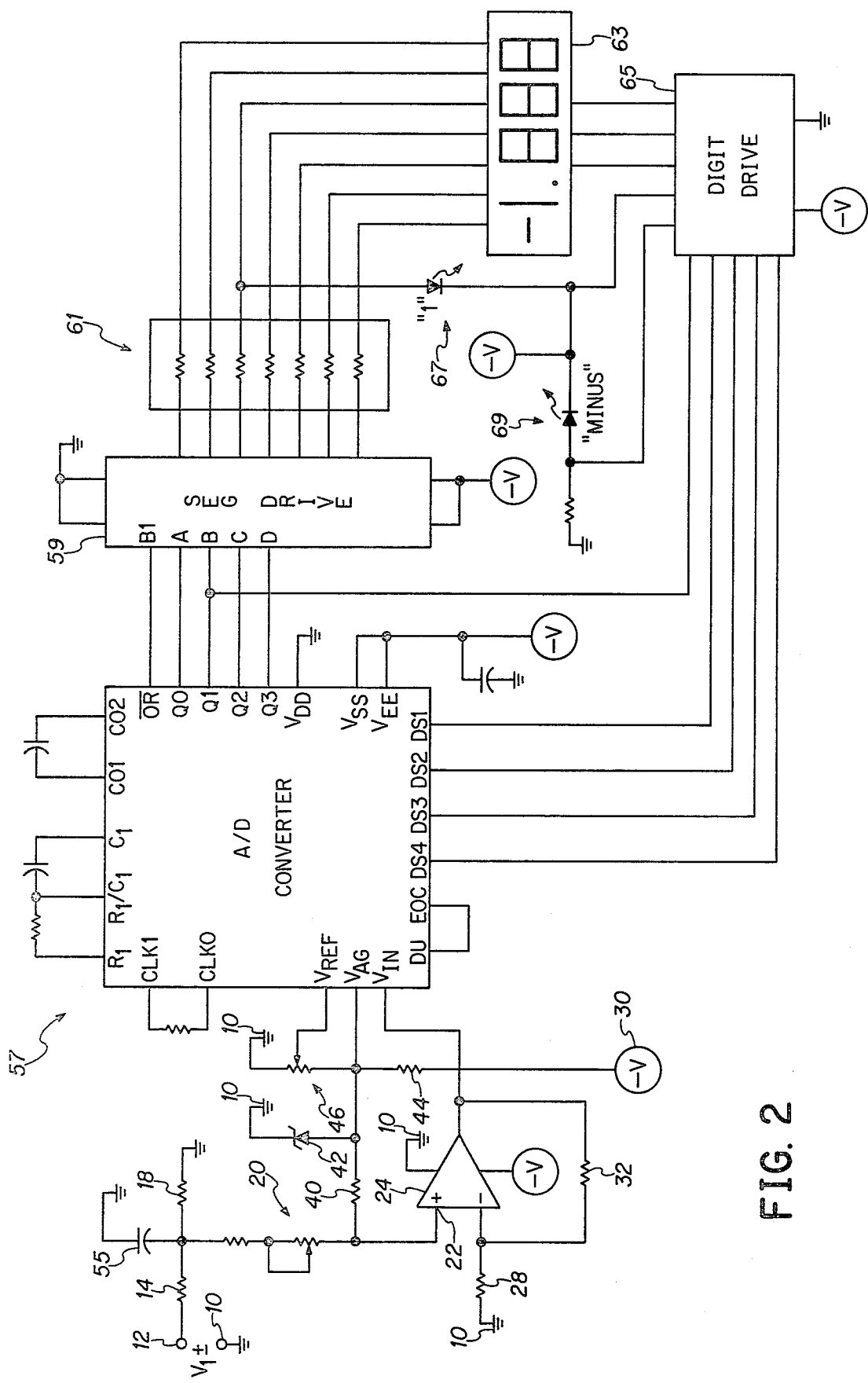
FIG. 2 is a block schematic diagram of the invention in combination with the additional circuitry required to provide a digital display output of a bipolar input signal being measured.

In FIG. 1 a bipolar input signal to be measured is labeled $V_1$ and is connected between a normal ground 10 and a non-grounded terminal 12. A resistor 14 is connected between terminal 12 and a junction point 16 which is further connected through a resistor 18 to ground 10. A resistor 20 is connected between junction point 16 and a positive or non-inverting input 22 of an operational amplifier 24. Amplifier 24 has an inverting input 26 connected through a resistor 28 to ground 10. Amplifier 24 receives power from a negative power terminal 30 and is connected between negative power terminal 30 and ground 10. Finally, a feedback resistor 32 is connected between an output 34 of amplifier 24 and the inverting input 26. As will be noted, output 34 of amplifier 24 is connected to a $V_{IN}$ terminal of a digital voltmeter (DVM) generally designated as 36 which has a display output 38. A resistor 40 is connected between input 22 of amplifier 24 and a terminal labeled $V_{AG}$ for voltage analog ground of digital voltmeter 36. The voltage analog ground ($V_{AG}$) is also referred to as a pseudoground since it is only a ground utilized for the purpose of operating the inventive concept. A zener diode 42 is connected between $V_{AG}$ and ground 10. A resistor 44 is connected between $V_{AG}$ and negative power terminal 30. A potentiometer or other voltage dividing network generally designated as 46 is connected between $V_{AG}$ and ground 10 and has an output connected to a terminal $V_{ref}$ of DVM 36. Divider 46 can be replaced by a Motorola integrated circuit number 1403 if more stability to this voltage reference is required than may be obtained using a potentiometer as illustrated. The DVM 36 is connected between negative power potential 30 and ground 10.

In FIG. 2, the same numbers are used where applicable. There is shown, in addition, a capacitor 55 to shunt alternating signal components to ground that are input at terminal 12. Also, resistor 20 is illustrated as a series resistor and variable resistor to provide fine tuning of the circuit. The DVM is broken up into an A to D converter 57, a segment driver 59, a resistor network 61, a 7-segment display 63 and a digit drive 65. Since the circuitry on the righthand portion of FIG. 2 is substantially identical with FIG. 12 of the Motorola data sheet or application note previously referenced, only a few comments will be made with respect thereto. An LED 67 is used to light the first digit (a "1") in the display 63. The display is what is termed in the industry a 3½ digit display where the 37 1" digit is either displayed or not since the maximum output obtainable from such a display is 1.999. In the same token, the minimum display is −1.999. A further LED 69 is used to light the negative or minus (−) segment or indicator of display 63 while the remaining portion of 63 comprises 7-segment displays which are lit by the plurality of segment drives obtained from resistor network 61 as selected by digit drive 65. Further, while comparison between FIG. 2 and the suggested circuit in the Motorola manual would indicate that terminal $V_{DD}$ of converter 57 is connected to the wrong potential, this is merely because the circuit illustrated in the application note is for a more conventional connection to plus and minus voltages as is normally provided in the industry.

In FIG. 3 a bipolar voltage $V_1$ is supplied to a junction point 80 and through a resistor 82 to a junction point 84 which junction point is also labeled $V_{IN}$. A resistor 86 is connected between junction point 84 and a junction point 88. A zener diode 90 is connected between a normal ground 92 and junction point 88. A further resistor 94 is connected between junction point 88 and a negative supply 96. A resistor divider network comprising resistors 98 and 100 are connected between junction point 88 and ground 92 to form a negative reference potential output labeled $V_{ref}$. A further set of resistors 102 and 104 are connected between junction point 88 and ground 92 with a divided output labeled $V_{AG}$ for voltage analog ground or pseudoground. Values have been placed on some of the resistors and other components in this figure to illustrate the concept utilized in designing the circuit illustrated in FIGS. 1 and 2 for the inventive concept.

In FIG. 4 the first column illustrates the amplitudes of signals applied to terminal 80 with respect to ground 92 while the second column of numbers indicates the signals output from the circuit at the terminal labeled $V_{IN}$ relative to normal ground 92 and the third or final column provides an indication of the value of this output voltage relative to the pseudoground $V_{AG}$.

OPERATION

Using FIG. 3 as an example, and using FIG. 4 for reference, it will be noted that with the values illustrated, there will be approximately −12 volts at junction point 88. If the resistors 102 and 104 are of equal value, the voltage at the analog ground ($V_{AG}$) will be −6 volts. Since the two resistors 82 and 86 are of equal value, the voltage at 84 will be a value which is exactly at the median voltage between that applied at junctions 80 and 88. Thus, the junction point 84, for +2 volts applied at $V_1$, will be −5 volts. −5 volts with respect to analog ground $V_{AG}$ is exactly +1 volt. In other words, the output voltage at $V_{IN}$ with respect to $V_{AG}$ is 1 volt positive or half the input voltage relative to its ground 92. If the voltage at input 80 is reduced to −1, the voltage at 84 will be −6.5 or in other words, −0.5 with respect to analog ground $V_{AG}$. From the chart it will be noted that it is still exactly half of the input voltage relative to the respective grounds and of the proper polarity. This is the basis upon which the invention is based.

The output $V_{ref}$ is a maximum value against which the digital voltmeter determines the output. In other words, when the voltage on $V_{IN}$ is the same value with respect to $V_{AG}$ as is $V_{ref}$, the digital voltmeter provides a maximum output of +1.999 volts. When it is of the same amplitude but of the opposite polarity, it provides an output of −1.999 volts which is the maximum output for the voltmeter. Thus, $V_{ref}$ is merely a reference point for the digital voltmeter and is not necessarily required to practice the inventive concept.

Referring now to FIG. 1, it will be noted that the resistors 14 and 18 are used as a voltage divider to reduce the input voltage from a high bipolar range to a much lower range that can be accommodated with the power supply voltages available for terminal 30. In the first embodiment of the inventive concept, the voltages $V_1$ ranged from +20 volts to −20 volts while the power supply available for supplying power to terminal 30 was only −12 volts. Thus, the voltage divider comprising resistors 14 and 18 reduced the input voltage to approximately 1/10 of the normal range. This voltage was summed with the approximately 5.6 volts from zener diode 42 in the same manner as mentioned with regard to FIG. 3 and the sum was applied to amplifier 24. Amplifier 24 was configured such that it multiplied the input voltage by 2 (doubled it) so as to have the proper range of voltages to the digital voltmeter 36.

The circuit of FIG. 1 is very stable since the source used to generate the summation current for the resistor 40 is in the same source that is used to generate the analog or pseudoground reference potential supplied to terminal $V_{AG}$ of the digital voltmeter. Therefore, the voltage tested by the digital voltmeter 36 is unaffected by any drift of the zener diode. While the zener diode 42 should be temperature compensated if there are severe problems so that the voltage supplied to $V_{ref}$ remains constant, this voltage for the reference can be generated by the previously referenced Motorola IC chip 1403.

The circuitry of FIG. 2 is substantially identical to the combination of FIG. 1 and the circuitry utilized in the referenced Motorola application notes. Thus, it is believed that further comments are unnecessary since the circuitry in the righthand portion of FIG. 2 from components 57 through 69 are merely used to convert the analog input to a digital output display. Basically, all of the blocks illustrated are purchased components and operate in a substantially standard manner other than the fact that they are driven off of a unipolar rather than a bipolar power supply.

While a single embodiment of the inventive concept has been illustrated, it will be realized by those skilled in the art that the invention may be practiced using other components and approaches to the solution of a problem for measuring the bipolar voltages.

Thus, I wish to be limited only by the scope of the appended claims wherein I claim:

1. Apparatus for measuring a bipolar potential signal using a unipolarity power supply and a normally bipolarity powered digital voltmeter (DVM) comprising, in combination:
   DVM including upper potential limit terminal means, reference voltage means, measured signal input means and display output means;
   apparatus reference potential means;
   power supply means for supplying unipolarity power between a given polarity supply terminal and said apparatus reference potential means;
   dividing means, connected between said given polarity supply terminal and said apparatus reference potential means for supplying to said upper potential limit terminal means and said reference voltage means of said DVM, signals which are intermediate in voltage the given polarity supply terminal of said power supply means and said apparatus reference potential means;
   measured voltage input means; and
   signal level shifting means, connected between said measured voltage input means and said measured signal input means of said DVM.

2. The method of converting a bipolar signal with respect to ground to a bipolar signal with respect to a generated pseudoground comprising, the steps of:
   generating a pseudoground intermediate in voltage a unipolar power supply terminal and normal ground; and
   summing a bipolar first signal to be measured with said pseudoground to provide a second signal which varies with respect to pseudoground in the same relative manner as does the bipolar signal with respect to normal ground.

3. Unipolar apparatus for establishing a new point of bipolar reference for an input bipolar signal comprising, in combination:
   reference potential first means;
   second means for supplying a bipolar input first signal with respect to said reference potential first means;
   third means for supplying a unipolar power second signal relative said reference potential first means;
   pseudoground generating fourth means, connected to said first and third means and outputting a pseudoground third signal; and
   summing means, connected to said second and fourth means, for combining said first and third signals to provide a fourth signal which varies with respect to said pseudoground third signal as does said first signal with respect to said reference potential first means.

4. Apparatus for converting a bipolar signal with respect to ground to a bipolar signal with respect to a generated pseudoground comprising, in combination:
   unipolar power supply terminal means;
   normal ground means;

input means for supplying a bipolar signal;
analog dividing means for dividing said bipolar signal to provide a first signal;
means for generating a pseudoground signal intermediate in voltage the voltage of said unipolar power supply terminal means and said normal ground means; and
means for summing said first signal with said pseudoground signal to provide a third signal which varies with respect to said pseudoground signal in the same relative manner as does the bipolar signal with respect to normal ground and is restricted in voltage range to no more than that defined by said unipolar power supply terminal means and said normal ground means.

* * * * *

UNITED STATES PATENT AND TRADEMARK OFFICE
CERTIFICATE OF CORRECTION

PATENT NO. : 4,274,050
DATED : 06/16/81
INVENTOR(S) : Thomas F. Martin

It is certified that error appears in the above-identified patent and that said Letters Patent are hereby corrected as shown below:

Column 2, line 31, delete --37--.

Column 2, line 53, replace "negative supply" with --negative power supply--.

Signed and Sealed this

Eighth Day of September 1981

[SEAL]

Attest:

GERALD J. MOSSINGHOFF

Attesting Officer

Commissioner of Patents and Trademarks